United States Patent [19]

Sugibayashi

[11] Patent Number: 5,416,368
[45] Date of Patent: May 16, 1995

[54] LEVEL CONVERSION OUTPUT CIRCUIT WITH REDUCED POWER CONSUMPTION

[75] Inventor: Tadahiko Sugibayashi, Tokyo, Japan

[73] Assignee: NEC Corporation, Tokyo, Japan

[21] Appl. No.: 232,407

[22] Filed: Apr. 25, 1994

Related U.S. Application Data

[63] Continuation of Ser. No. 884,156, May 18, 1992, abandoned.

[30] Foreign Application Priority Data

May 17, 1991 [JP]    Japan .................................. 3-141333

[51] Int. Cl.⁶ ........................................ H03K 19/0948
[52] U.S. Cl. ........................................ 326/68; 326/21; 326/121
[58] Field of Search ............. 307/443, 451, 475, 296.5

[56] References Cited

U.S. PATENT DOCUMENTS

| | | | |
|---|---|---|---|
| 4,490,633 | 12/1984 | Noufer et al. | 307/475 |
| 4,574,273 | 3/1986 | Atsumi et al. | 307/475 |
| 4,587,446 | 5/1986 | Okumura | 307/443 |
| 4,857,763 | 8/1989 | Sakurai et al. | 307/443 |
| 5,151,616 | 9/1992 | Komuro | 307/443 |

Primary Examiner—Edward P. Westin
Assistant Examiner—Benjamin D. Driscoll
Attorney, Agent, or Firm—Sughrue, Mion, Zinn, Macpeak & Seas

[57] ABSTRACT

A level conversion output circuit includes two level conversion circuits for "high" and "low" logic signals, each of which includes a first CMOS inverter operating between an internal power supply of 3.3 V and ground, and a second CMOS inverter operating between an external power supply of 5 V and ground. One of the level conversion circuits is provided with an additional p-MOS transistor so that a 5.0 V voltage is applied to a gate of a p-MOS transistor of the second CMOS inverter from the external power supply through the additional p-MOS transistor, when the p-MOS transistor of the second CMOS inverter is controlled to be turned off.

7 Claims, 3 Drawing Sheets

LEVEL CONVERSION OUTPUT CIRCUIT WITH REDUCED POWER CONSUMPTION

This is a Continuation of application Ser. No. 07/884,156 filed May 18, 1992, now abandoned.

FIELD OF THE INVENTION

This invention relates to a level conversion output circuit, and more particularly to, a level conversion output circuit for a semiconductor integrated circuit having a DRAM of more than 16M bits.

BACKGROUND OF THE INVENTION

In a semiconductor integrated circuit, a DRAM (dynamic random access memory) having a capacity of less than 4M bits is operated by using a power supply of 5 V. However, the power supply of 5 V cannot be used for a DRAM having a capacity of more than 16M bits, because each memory element is minute for high density to have a thin gate oxide layer, so that the gate oxide layer is degraded due to the application of 5 V. Accordingly, a semiconductor IC having a large capacity DRAM is provided with an internal power supply of 3.3 V for the large capacity DRAM excluding word lines applied with a voltage of 5 V, and with a level conversion output circuit for converting a level of an output signal generated by the internal power supply to 5 V to be adapted to 5 V-logic circuits and then supplied to an external circuit.

A conventional level conversion output circuit includes first (for "high") and second (for "low") level conversion circuits connected to first and second input terminals to be supplied with input signals of "high (3.3 V)" and "low", respectively, a first n-MOS transistor connected at a gate to an output of the first level conversion circuit, and a second n-MOS transistor connected at a gate to an output of the second level conversion circuit. The first n-MOS transistor is connected at a source to a power supply of 5 V and at a drain to an output terminal from which "high (5 V)" and "low" signals are obtained, and the second n-MOS transistor is connected at a source to ground and at a drain to the output terminal. Each of the first and second n-MOS transistors has gate oxide layer having strength against a voltage of 5.5 V, respectively, so that the gate oxide layer is not degraded by a voltage applied from the power supply with a margin of 10%.

The first and second level conversion circuits have the same structure. That is, each of the level conversion circuits is composed of first and second CMOS (complementary metal-oxide semiconductor) inverters which are cascade-connected. The first CMOS inverter is composed of a first p-MOS transistor connected at a source to an internal power supply of 3.3 V and at a gate to the first input terminal, and a third n-MOS transistor connected at a source to ground and at a gate to the first input terminal and at a drain to a drain of the first p-MOS transistor. The second CMOS inverter is composed of a second p-MOS transistor connected at a source to an external power supply of 5 V and at a drain to the gate of the first n-MOS transistor, and a fourth n-MOS transistor connected at a source to ground, at a drain to the gate of the second n-MOS transistor and at a gate to a gate of the second p-MOS transistor. The common drain of the first CMOS inverter is connected to the common gate of the second CMOS inverter.

In operation, in the first level conversion circuit, when a high level signal is supplied to the first input terminal, a low level signal is supplied from the first CMOS inverter to the second CMOS inverter. In response to the low level signal, the second p-MOS transistor is turned on and the fourth n-MOS transistor is turned off, so that a high level signal is supplied to the gate of the first n-MOS transistor. In the second level conversion circuit, when a low level signal is supplied to the second input terminal, a high level signal is supplied from the first CMOS inverter to the second CMOS inverter. In response to the high level signal, the second p-MOS transistor is turned off and the fourth n-MOS transistor is turned on, so that a low level signal is supplied to the gate of the second n-MOS transistor. As the result, a high level output of 5 V is obtained at the output terminal.

In the opposite manner, when a low level signal is supplied to the first input terminal and a high level signal is supplied to the second input terminal, a low level output signal is obtained at the output terminal.

According to the conventional level conversion output circuit, however, there is a disadvantage in that the second p-MOS transistor of the second CMOS inverter can not be completely turned off to cause the flow of current in each second inverter of the first and second level conversion circuits, because "high" signal applied to the gate thereof is 3.3 V, when "low" signals are applied to the first and second input terminals. As a result, power consumption is increased.

Further, when a level of the output terminal is changed from high to low by the inversion of input signals from a state in which "high" and "low" are applied to the first and second input terminals to a state in which "low" and "high" are supplied to the first and second input terminals, a voltage of over 5.5 V is applied to the gate of the second n-MOS transistor in a moment by an overshoot based on the voltage transition of 0 to 5 V. Therefore, the gate oxide layer of the second n-MOS transistor is degraded, a reliability of the semiconductor integrated circuit is lowered.

SUMMARY OF THE INVENTION

Accordingly, it is an object of the invention to provide a level conversion output circuit in which no current flows through a second inverter on application of "high" signal or 3.3 V thereto, thereby decreasing power consumption.

It is a further object of the invention to provide a level conversion output circuit in which a gate oxide layer of a MOS transistor is not degraded by a voltage overshoot based on the state change of input signals.

According to the invention, a level conversion output circuit, including:

first and second level conversion circuits which are supplied with input signals from a predetermined circuit operating by a first power supply;

a first MOS transistor connected at a source-drain path to a second power supply for supplying a voltage higher than the first power supply, at a gate to an output of the first level conversion circuit and at the source-drain path to an output terminal; and a second MOS transistor connected at a source-drain path to ground, at a gate to an output of the second level conversion circuit and at the source-drain path to the output terminal in common to the first MOS transistor;

wherein the first level conversion circuit comprises a first CMOS inverter operating between the first power supply and the ground, a second CMOS inverter operating between the second power supply and the ground, and a p-MOS transistor connected at a source to the second power supply, at a drain to a gate of p-MOS transistor of the second CMOS inverter and at a gate to the output terminal.

BRIEF DESCRIPTION OF THE DRAWINGS

The invention will be explained in more detail in conjunction with appended drawings; wherein.

DESCRIPTION OF THE PREFERRED EMBODIMENTS

Before describing a level conversion output circuit according to the invention, the briefly aforementioned conventional level conversion output circuit will be explained in conjunction with FIGS. 1 to 3.

Figure 1:
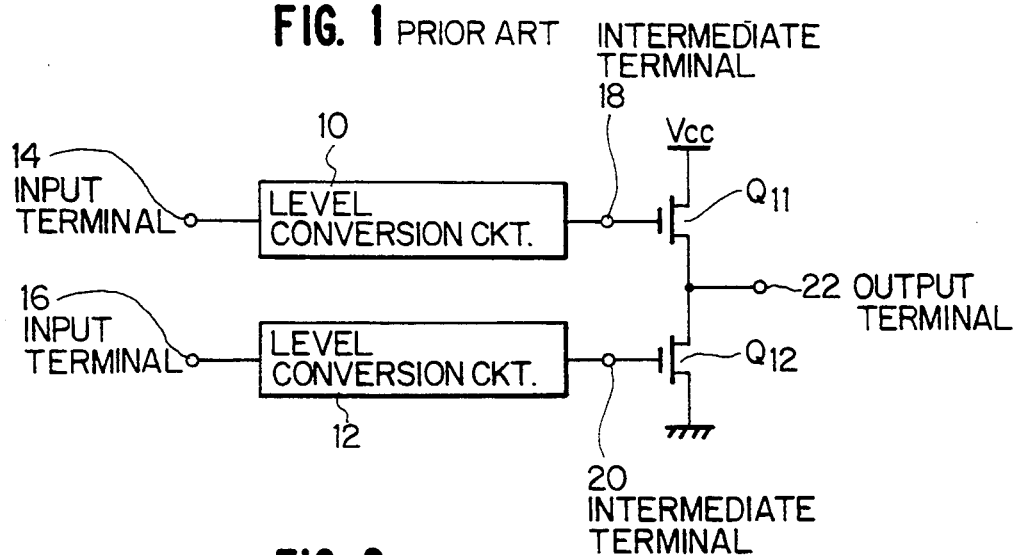
FIG. 1 is a schematic block diagram showing a conventional level conversion output circuit.

FIG. 1 shows the conventional level conversion output circuit for a semiconductor IC (integrated circuit). The level conversion output circuit includes two level conversion circuits 10 (for "high") and 12 (for "low") connected between input terminals 14 and 16 and intermediate terminals 18 and 20, respectively, and n-MOS transistors $Q_{11}$ and $Q_{12}$.

The n-MOS transistor $Q_{11}$ is connected at a gate to the intermediate terminal 18, at a source to a power supply $V_{cc}$ of 5 V and at a drain to an output terminal 22 connected to a logic circuit driven by logic signals of "high" of 5 V and "low" of ground (not shown), and the n-MOS transistor $Q_{12}$ is connected at a gate to the intermediate terminal 20, at a source to ground and at a drain to the output terminal 22. Each of the n-MOS transistors $Q_{11}$ and $Q_{12}$ has gate oxide layer having strength against voltage of 5.5 V, respectively, so that the gate oxide layer is not degraded by a voltage applied from the power supply $V_{cc}$ with 10% margin.

Figure 2:
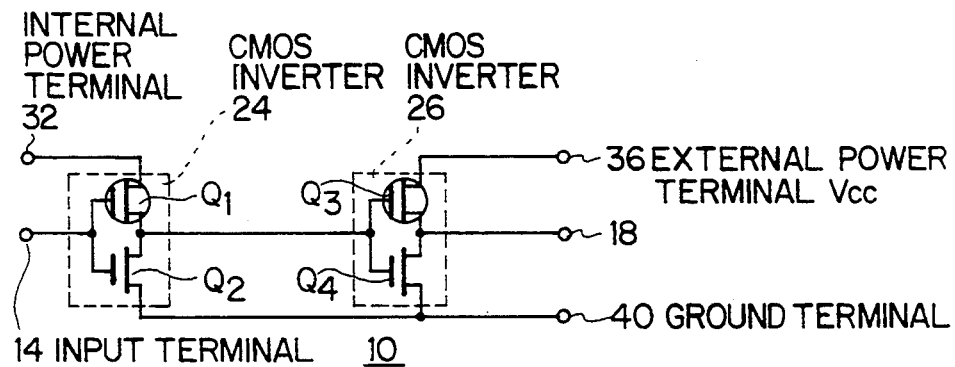
FIGS. 2 and 3 are circuit diagrams showing level conversion circuits used in the conventional level conversion output circuit, respectively.
Figure 3:
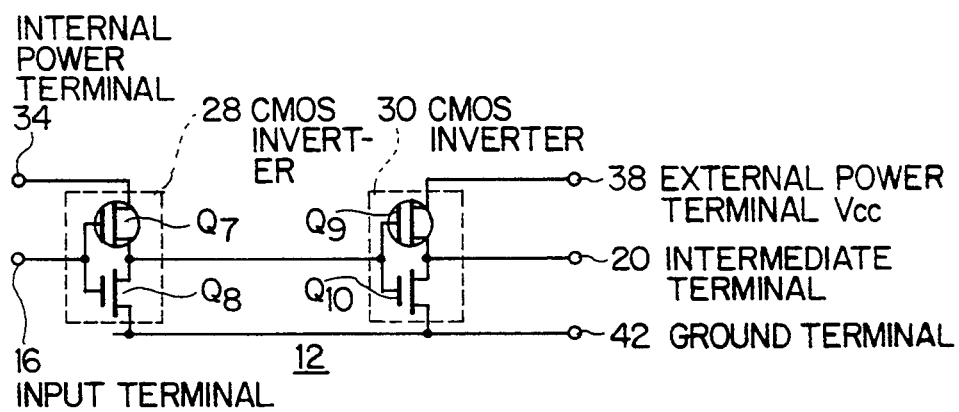

FIGS. 2 and 3 show the level conversion circuits 10 and 12 described before. The level conversion circuits 10 and 12 have the same structure, so that only the level conversion circuit 10 will be explained in structure.

The level conversion circuit 10 is composed of two CMOS (complementary metal-oxide semiconductor) inverters 24 and 26 which are cascade-connected. Each of the CMOS inverters 24 and 26 is composed of p-MOS transistor $Q_1$ ($Q_3$) and n-MOS transistor $Q_2$ ($Q_4$). The p-MOS transistor $Q_1$ and the n-MOS transistor $Q_2$ are connected at gates to the input terminal 14 in common, the common drain of the p-MOS transistor $Q_1$ and the n-MOS transistor $Q_2$ is connected to the common gate of the p-MOS transistor $Q_3$ and the n-MOS transistor $Q_4$, and drains of the p-MOS transistor $Q_3$ and the n-MOS transistor $Q_4$ are connected to the intermediate terminal 18 in common. The p-MOS transistor $Q_1$ is connected at source to an internal power terminal 32 to be applied with a voltage of 3.3 V, and the p-MOS transistors $Q_3$ is connected at source to an external power terminal 36 to be applied with a voltage of 5.0 V. Tile n-MOS transistors $Q_2$ and $Q_4$ are connected at sources to a ground terminal 40 in common to be applied with a ground voltage.

Next, operation of the conventional level conversion output circuit will be explained in conjunction with the following table.

| INPUT 14 | $Q_1$ | $Q_2$ | $Q_3$ | $Q_4$ | TERMINAL 18 | $Q_{11}$ | OUTPUT 22 |
|---|---|---|---|---|---|---|---|
| HIGH | OFF | ON | ON | OFF | HIGH | ON | |
| INPUT 16 | $Q_7$ | $Q_8$ | $Q_9$ | $Q_{10}$ | TERMINAL 20 | $Q_{12}$ | HIGH |
| LOW | ON | OFF | OFF | ON | LOW | OFF | |

When a high level signal is supplied to the input terminal 14 and a low level signal is supplied to the input terminal 16, the p-MOS transistor $Q_1$ and the n-MOS transistor $Q_8$ are turned off, and the n-MOS transistor $Q_2$ and the p-MOS transistor $Q_7$ are turned on. Therefore, a low level signal is supplied to the common gate of the p-MOS transistor $Q_3$ and the n-MOS transistor $Q_4$, and a high level signal is supplied to the common gate of the p-MOS transistor $Q_9$ and the n-MOS transistor $Q_{10}$.

In response to the low level signal, the p-MOS transistor $Q_3$ is turned on and the n-MOS transistor $Q_4$ is turned off, and the p-MOS transistor $Q_9$ is turned off and the n-MOS transistor $Q_{10}$ is turned on. Therefore, a high level signal is supplied to the gate of the n-MOS transistor $Q_{11}$ through the intermediate terminal 18, and a low level signal is supplied to the gate of the n-MOS transistor $Q_{12}$ through the intermediate terminal 20. Then, the n-MOS transistor $Q_{11}$ is turned on and the n-MOS transistor $Q_{12}$ is turned off, so that a fifth level output signal is obtained at the output terminal 22.

On the other hand, when a low level signal is supplied to the input terminal 14 and a high level signal is supplied to the input terminal 16, a low level output signal is supplied from the output terminal 22 as shown the following table.

| INPUT 14 | $Q_1$ | $Q_2$ | $Q_3$ | $Q_4$ | TERMINAL 18 | $Q_{11}$ | OUTPUT 22 |
|---|---|---|---|---|---|---|---|
| LOW | ON | OFF | OFF | ON | LOW | OFF | |
| INPUT 16 | $Q_7$ | $Q_8$ | $Q_9$ | $Q_{10}$ | TERMINAL 20 | $Q_{12}$ | LOW |
| HIGH | OFF | ON | ON | OFF | HIGH | ON | |

According to the conventional level conversion output circuit, however, there is a disadvantage in that the p-MOS transistor $Q_3$ of the CMOS inverter 26 cannot be completely turned off to cause the flow of current in each inverter of the first and second level conversion circuits 10 and 12, because "high" signal applied to the gate thereof is 3.3 V, when signals are applied to the input terminals 14 and 16. As a result, power consumption is increased.

Further, when a level of the output terminal 22 is changed from high to low by the inversion of input signals from a state in which "high" and "low" are applied to the input terminals 14 and 16 to a state in which "low" and "high" are supplied to the input terminals 14 and 16, a voltage of over 5.5 V is applied to the gate of the n-MOS transistor $Q_{12}$ in a moment by an overshoot based on the voltage translation of 0 to 5 V. Therefore, the gate oxide layer of the n-MOS transistor $Q_{12}$ is degraded, a reliability of the semiconductor integrated circuit is lowered.

Next, a level conversion output circuit of preferred embodiments according to the invention will be explained in conjunction with FIGS. 4 to 7. In the preferred embodiments, explanation for the same structure and the same components as the conventional level conversion output circuit will be omitted.

Figure 4:
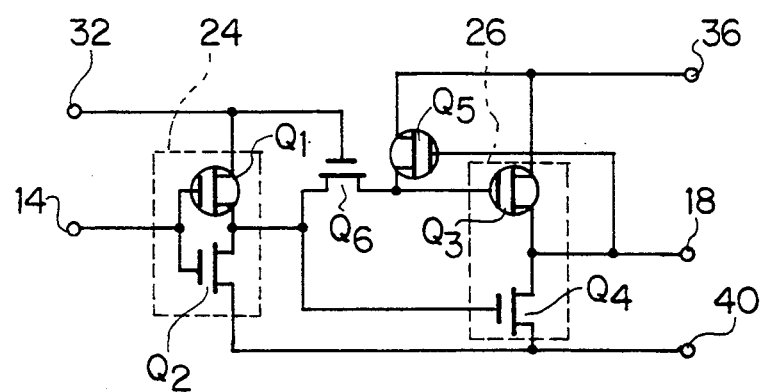
FIGS. 4 and 5 are circuit diagrams showing level conversion circuits used in a level conversion output circuits of a first preferred embodiment according to the invention, respectively.
Figure 5:
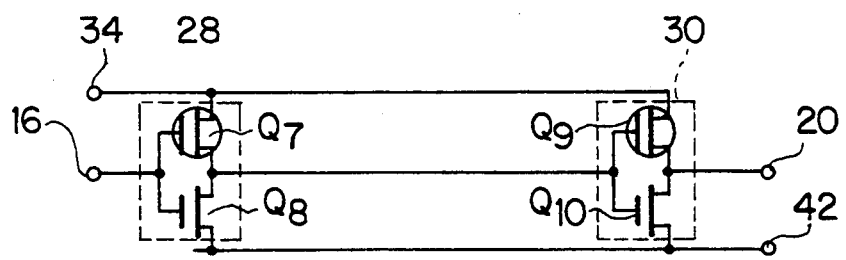

FIGS. 4 and 5 show level conversion circuits 10 (for "high") and 12 (for "low") used in the level conversion output circuit of the first preferred embodiment according to the invention. The level conversion circuit 10 includes an n-MOS transistor $Q_6$ connected at a gate to an internal power terminal 32 and at a source and a drain to a common drain of a p-MOS transistor $Q_1$ and an n-MOS transistor $Q_2$ and to a gate of p-MOS transistor $Q_3$, and a p-MOS transistor $Q_5$ connected at a source to an external power terminal 36, at a gate to an intermediate terminal 18 and at a drain to the gate of the p-MOS transistor $Q_3$.

In the level conversion circuit a p-MOS transistor $Q_9$ is connected at a source to an internal power terminal 34 common with a source of a p-MOS transistor $Q_7$. No voltage is supplied to any transistor therein by the external power supply $V_{cc}$.

Next, operation of the first preferred embodiment will be explained in conjunction with the following table.

| INPUT 14 | $Q_1$ | $Q_2$ | $Q_3$ | $Q_4$ | $Q_5$ | $Q_6$ | TERMINAL 18 | $Q_{11}$ | OUTPUT 22 |
|---|---|---|---|---|---|---|---|---|---|
| HIGH | OFF | ON | ON | OFF | OFF | ON | HIGH | ON | |
| INPUT 16 | $Q_7$ | $Q_8$ | $Q_9$ | $Q_{10}$ | | | TERMINAL 20 | $Q_{12}$ | HIGH |
| LOW | ON | OFF | OFF | ON | | | LOW | OFF | |

In the level conversion circuit 10, when a low level signal is supplied to the input terminal 14, the p-MOS transistor $Q_1$ is turned on and the n-MOS transistor $Q_2$ is turned off. Then high level signal is supplied to the source of the n-MOS transistor $Q_6$ and to the gate of n-MOS transistor $Q_4$, so that the n-MOS transistor $Q_4$ is turned on. At this time, the p-MOS transistor $Q_5$ is turned on, so that a high level signal of 5.0 V is supplied to the gate of the p-MOS transistor $Q_3$ through the p-MOS transistor $Q_5$. As the result, the p-MOS transistor $Q_3$ is completely turned off, and a low level signal is supplied from the intermediate terminal 18 to the n-MOS transistor $Q_{11}$. Under the situation where the p-MOS transistor $Q_5$ is turned on, the n-MOS transistor $Q_6$ is turned off. When a low level signal is supplied to the n-MOS transistor $Q_{11}$, the n-MOS transistor $Q_{11}$ is turned off. Because of the complete off of the p-MOS transistor $Q_3$, no current passes between the external power supply $V_{cc}$ and ground, and, because of the n-MOS transistor $Q_6$ thus turned off, no current passes between the external and internal power supplies 36 and 32.

In the level conversion circuit 12, when a high level signal is supplied to the input terminal 16, the n-MOS transistor $Q_7$ is turned off and the n-MOS transistor $Q_8$ is turned on. Then, a low level signal is supplied to the common gate of the p-MOS transistor $Q_9$ and the n-MOS transistor $Q_{10}$, so that the p-MOS transistor $Q_9$ is turned on and the n-MOS transistor $Q_{10}$ is turned off. Then, a high level signal of 3.3 V is supplied from the intermediate terminal 20 to the n-MOS transistor $Q_{12}$, so that the n-MOS transistor $Q_{12}$ is turned on. Therefore, a low level signal is obtained at the output terminal 22.

On the other hand, when a high level signal is supplied to the input terminal 14 and a low level signal is supplied to the input terminal 16, a high level output signal of 5 V is supplied from the output terminal 22 as shown in the following table.

As described above, according to the first preferred embodiment, a voltage of 5.0 V is applied to the gate of the p-MOS transistor $Q_3$ through the p-MOS transistor $Q_5$, when a low level signal is supplied to the input terminal 14. Therefore, the p-MOS transistor $Q_3$ is turned off completely. Further, the p-MOS transistor $Q_9$ is also turned off completely, because the same voltage of 3.3 V is applied to the source and the gate thereof.

In addition, when an input signal state is changed from "low" and "high" to "high" and "low" to provide the change of the output terminal level from "high" to "low", a voltage slightly more than 3.3 V is applied to the gate of the n-MOS transistor $Q_{12}$ in a moment by an overshoot. Therefore, the gate oxide layer of the n-MOS transistor $Q_{12}$ is not degraded by the overshoot.

In the first preferred embodiment, a p-MOS transistor may be used instead of the n-MOS transistor $Q_{11}$. In such a structure, the same level signals must be supplied to the input terminals 14 and 16 at the same time.

Figure 6:
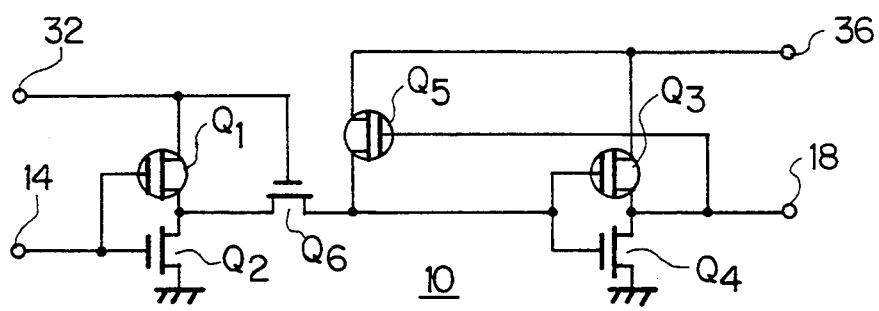
FIG. 6 is a circuit diagram showing a level conversion circuit used in a level conversion output circuit of a second preferred embodiment according to the invention.

FIG. 6 shows a level conversion circuit 10 of a second preferred embodiment according to the invention. In the level conversion circuit 10, an n-MOS transistor $Q_4$ is connected at a gate to a source or a drain of an n-MOS transistor $Q_6$.

Figure 7:
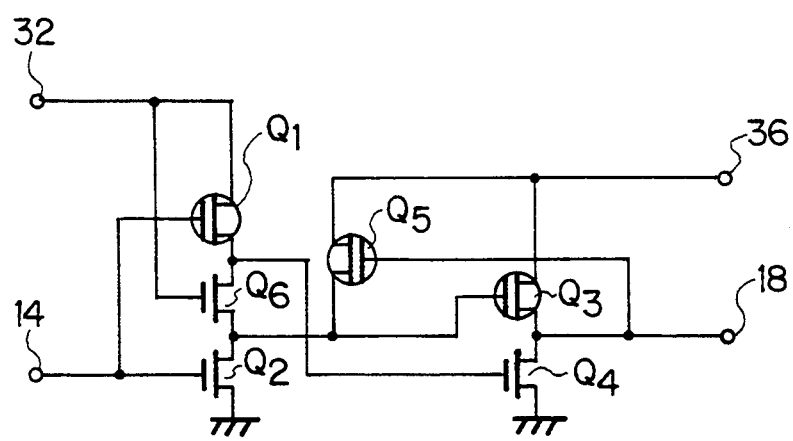
FIG. 7 is a circuit diagram showing a level conversion circuit used in a level conversion output circuit of a third preferred embodiment according to the invention.

FIG. 7 shows a level conversion circuit 10 of a third preferred embodiment according to the invention. In the level conversion circuit 10, an n-MOS transistor $Q_6$ is connected between a p-MOS transistor $Q_1$ and an n-MOS transistor $Q_2$ at a drain and a source, and a gate of a p-MOS transistor $Q_3$ and a drain of a p-MOS transistor $Q_5$ are connected to a connection point between a drain of the n-MOS transistor $Q_2$ and a drain of the n-MOS transistor $Q_6$.

According to the second and third preferred embodiments, the level conversion circuits 10 operate in the same manner as the first preferred embodiment, respectively.

Although the invention has been described with respect to specific embodiment for complete and clear disclosure, the appended claims arc not to be thus limited but are to be construed as embodying all modification and alternative constructions that may occur to one skilled in the art which fairly fall within the basic teaching herein set forth.

What is claimed is:

1. A level conversion circuit comprising:
    a first power supply line supplied with a first power voltage;
    a second power supply line supplied with a second power voltage larger than said first power voltage;
    a reference potential supply line supplied with a reference potential;
    a first input terminal supplied with a first input signal having an amplitude between said first power voltage and said reference potential;
    a second input terminal supplied with a second input signal having an amplitude between said first power voltage and said reference potential and a phase opposite to a phase of said first input signal;
    an output terminal;
    a first transistor having a source-drain path connected between said second power supply line and said output terminal;
    a second transistor having a source-drain path connected between said output terminal and said reference potential supply line;
    a first conversion circuit, coupled to said first power supply line, said second power supply line, said reference potential and between said first input terminal and a gate of said first transistor, which converts said first input signal into a first intermediate signal having an amplitude between said second power voltage and said reference potential and for driving said first transistor by supplying said first intermediate signal to said gate of said first transistor; and
    a second conversion circuit, coupled between said second input terminal and a gate of said second transistor, which drives said second transistor by a second intermediate signal, said second conversion circuit comprising:
        a first CMOS inverter having a first input node connected to said second input terminal and a first output node, said first CMOS inverter being connected between said first power supply line and said reference potential supply line to operate on a voltage between said first power voltage and said reference potential; and
        a second CMOS inverter having a second input node connected to said first output node of said first CMOS inverter and a second output node connected to said gate of said second transistor, said second CMOS inverter being connected between said first power supply line and said reference potential supply line to operate on a voltage between said first power voltage and said reference potential;
    wherein said second intermediate signal output by said conversion second circuit is one of a first logic level equal to said first power voltage and a second logic level equal to said reference potential, said second transistor being activated when said second intermediate signal having said first logic level is applied to said gate of said second transistor, and wherein a voltage larger than a voltage between said second power voltage and said reference potential resulting from activation of said second transistor is prevented from being applied between said gate and a source of said second transistor; and
    wherein said second transistor is turned off when said second intermediate signal having said second logic level is applied to said gate of said second transistor.

2. The level conversion circuit as claimed in claim 1, wherein said first transistor and said second transistor are of a first channel type;
    wherein said first CMOS inverter comprises:
        a third transistor of a second channel type having a source-drain path connected between said first power supply line and said first output node and a gate connected to said second input terminal; and
        a fourth transistor of said first channel type having a source-drain path connected between said first output node and said reference potential supply line and a gate connected to said second input terminal; and
    wherein said second CMOS inverter comprises:
        a fifth transistor of said second channel type having a source-drain path connected between said first power supply line and said second output node and a gate connected to said first output node; and
        a sixth transistor of said first channel type having a source-drain path connected between said second output node and said reference potential supply line and a gate connected to said first output node.

3. The level conversion circuit as claimed in claim 2, wherein said first conversion circuit comprises:
    a third CMOS inverter having a third input node connected to said first input terminal and a third output node, said third CMOS inverter being connected between said first power supply line and said reference potential supply line to operate on a voltage between said first power voltage and said reference potential;
    a fourth CMOS inverter having a fourth input node connected to said third output node of said third CMOS inverter, a fifth input node and a fourth output node connected to said gate of said first transistor via a first intermediate terminal, said fourth CMOS inverter being connected between said second power supply line and said reference potential supply line to operate on a voltage between said second power voltage and said reference potential;
    a seventh transistor of said first channel type having a gate connected to said first power supply line and a source-drain path connected between said fourth input node and said fifth input node of said fourth CMOS inverter; and an eighth transistor of said second channel type having a gate connected to said first intermediate terminal and a source-drain path connected between said second power supply line and said fifth input node of said fourth CMOS inverter;

wherein said first intermediate signal output by said first conversion circuit is one of a first logic level equal to said second power voltage and a second logic level equal to said reference potential, said first transistor being activated when said first intermediate signal having said first logic level is applied to said gate of said first transistor; and wherein said third CMOS inverter comprises:
  a transistor of said second channel type having a source-drain path connected between said first power supply line and said third output node and a gate connected to said first input terminal; and
  a transistor of said first channel type having a source-drain path connected between said third output node and said reference potential supply line and a gate connected to said first input terminal; and wherein said fourth CMOS inverter comprises:
  a transistor of said second channel type having a source-drain path connected between said second power supply line and said fourth output node and a gate connected to said fifth input node; and
  a transistor of said first channel type having a source-drain path connected between said fourth output node and said reference potential supply line and a gate connected to said fourth input node.

4. The level conversion circuit as claimed in claim 2, wherein said first conversion circuit comprises:
  a third CMOS inverter having a third input node connected to said first input terminal and a third output node, said third CMOS inverter being connected between said first power supply line and said reference potential supply line to operate on a voltage between said first power voltage and said reference potential;
  a fourth CMOS inverter having a fourth input node connected to said third output node of said third CMOS inverter and a fourth output node connected to said gate of said first transistor via a first intermediate terminal, said fourth CMOS inverter being connected between said second power supply line and said reference potential supply line to operate on a voltage between said second power voltage and said reference potential;
  a seventh transistor of said first channel type having a gate connected to said first power supply line and a source-drain path connected between said third output node of said third CMOS inverter and said fourth input node of said fourth CMOS inverter; and
  an eighth transistor of said second channel type having a gate connected to said first intermediate terminal and a source-drain path connected between said second power supply line and said fourth input node of said fourth CMOS inverter; and wherein said third CMOS inverter comprises:
  a transistor of said second channel type having a source-drain path connected between said first power supply line and said third output node and a gate connected to said first input terminal; and
  a transistor of said first channel type having a source-drain path connected between said third output node and said reference potential supply line and a gate connected to said first input terminal; and wherein said fourth CMOS inverter comprises:
  a transistor of said second channel type having a source-drain path connected between said second power supply line and said fourth output node and a gate connected to said fourth input node: and
  a transistor of said first channel type having a source-drain path connected between said fourth output node and said reference potential supply line and a gate connected to said fourth input node.

5. The level conversion circuit as claimed in claim 2, wherein said first conversion circuit comprises:
  a third CMOS inverter having a third input node connected to said first input terminal, a third output node and a fourth output node, said third CMOS inverter being connected between said first power supply line and said reference potential supply line to operate on a voltage between said first power voltage and said reference potential;
  a fourth CMOS inverter having a fourth input node connected to said fourth output node of said third CMOS inverter, a fifth input node connected to said third output node of said third CMOS inverter and a fifth output node connected to said gate of said first transistor via a first intermediate terminal, said fourth CMOS inverter being connected between said second power supply line and said reference potential supply line to operate on a voltage between said second power voltage and said reference potential;
  a seventh transistor of said first channel type having a gate connected to said first power supply line and a source-drain path connected between said third output node and said fourth output node of said third CMOS inverter; and
  an eighth transistor of said second channel type having a gate connected to said first intermediate terminal and a source-drain path connected between said second power supply line and said fourth input node of said fourth CMOS inverter; and wherein said third CMOS inverter comprises:
  a transistor of said second channel type having a source-drain path connected between said first power supply line and said third output node and a gate connected to said first input terminal; and
  a transistor of said first channel type having a source-drain path connected between said fourth output node and said reference potential supply line and a gate connected to said first input terminal; and wherein said fourth CMOS inverter comprises:
  a transistor of said second channel type having a source-drain path connected between said second power supply line and said fifth output node and a gate connected to said fourth input node; and
  a transistor of said first channel type having a source-drain path connected between said fifth output node and said reference potential supply line and a gate connected to said fifth input node.

6. A level conversion circuit comprising:

a first power supply line supplied with a first power voltage;

a second power supply line supplied with a second power voltage larger than said first power voltage;

a reference potential supply line supplied with a reference potential;

a first input terminal supplied with a first input signal having an amplitude between said first power voltage and said reference potential;

a second input terminal supplied with a second input signal having an amplitude between said first power voltage and said reference potential and a phase opposite to a phase of said first input signal;

an output terminal;

a first transistor of a first channel type having a source-drain path connected between said second power terminal and said output terminal;

a second transistor of said first channel type having a source-drain path connected between said output terminal and said reference potential line;

a first conversion circuit, coupled between said first input terminal and a gate of said first transistor, which drives said first transistor in response to said first input signal; and a second conversion circuit, coupled to said first power supply line, said reference potential supply line and between said second input terminal and a gate of said second transistor, which drives said second transistor in response to said second input signal;

said first conversion circuit comprising:

a first CMOS inverter having a first input node connected to said first input terminal and a first output node, said first CMOS inverter being connected between said first power supply line and said reference potential supply line to operate on a voltage between said first power voltage and said reference potential;

a second CMOS inverter having a second input node connected to said first output node of said first CMOS inverter, a third input node and a second output node connected to said gate of said first transistor via a first intermediate terminal, said second CMOS inverter being connected between said second power supply line and said reference potential supply line to operate on a voltage between said second power voltage and said reference potential;

a seventh transistor of said first channel type having a gate connected to said first power supply line and a source-drain path connected between said second input node and said third input node of said second CMOS inverter; and an eighth transistor of said second channel type having a gate connected to said first intermediate terminal and a source-drain path connected between said second power supply line and said third input node of said second CMOS inverter; and wherein said first CMOS inverter comprises:

a transistor of said second channel type having a source-drain path connected between said first power supply line and said first output node and a gate connected to said first input terminal; and a transistor of said first channel type having a source-drain path connected between said first output node and said reference potential supply line and a gate connected to said first input terminal; and wherein said second CMOS inverter comprises:

a transistor of said second channel type having a source-drain path connected between said second power supply line and said second output node and a gate connected to said third input node, and a transistor of said first channel type having a source-drain path connected between said second output node and said reference potential supply line and a gate connected to said second input node;

wherein said first intermediate signal output by said first conversion circuit is one of a first logic level equal to said second power voltage and a second logic level equal to said reference potential, said first transistor being activated when said first intermediate signal having said first logic level is applied to said gate of said first transistor.

7. A level of conversion circuit comprising:

a first power supply line supplied with a first power voltage;

a second power supply line supplied with a second power voltage larger than said first power voltage;

a reference potential supply line supplied with a reference potential;

a first input terminal supplied with a first input signal having an amplitude between said first power voltage and said reference potential;

a second input terminal supplied with a second input signal having an amplitude between said first power voltage and said reference potential and a phase opposite to a phase of said first input signal;

an output terminal;

a first transistor of a first channel type having a source-drain path connected between said second power terminal and said output terminal;

a second transistor of said first channel type having a source-drain path connected between said output terminal and said reference potential line;

a first conversion circuit, coupled between said first input terminal and a gate of said first transistor, which drives said first transistor in response to said first input signal; and a second conversion circuit, coupled between said second input terminal and a gate of said second transistor, which drives said second transistor in response to said second input signal;

said first conversion circuit comprising:

a first CMOS inverter having a first input node connected to said first input terminal and a first output node, said first CMOS inverter being connected between said first power supply line and said reference potential supply line to operate on a voltage between said first power voltage and said reference potential;

a second CMOS inverter having a second input node connected to said first output node of said first CMOS inverter, a third input node and a second output node connected to said gate of said first transistor via a first intermediate terminal, said second CMOS inverter being connected between said second power supply line and said reference potential supply line to operate on a voltage between said second power voltage and said reference potential;

a seventh transistor of said first channel type having a gate connected to said first power supply line and a source-drain path connected between said second input node and said third input node of said second CMOS inverter; and an eighth transistor of said second channel type having a gate connected to said first intermediate terminal and a source-drain path connected between said second power supply line and said third input node of said second CMOS inverter; and said second conversion circuit comprising:

a third CMOS inverter having a fourth input node connected to said second input terminal and a third output node, said third CMOS inverter being connected between said first power supply line and said reference potential supply line to operate on a voltage between said first power voltage and said reference potential; and a fourth CMOS inverter having a fifth input node connected to the third output node of said third CMOS inverter and a fourth output node connected to said gate of said second transistor, said fourth CMOS inverter being connected between said first power supply line and said reference potential supply line to operate on a voltage between said first power voltage and said reference potential;

wherein said first intermediate signal output by said first conversion circuit is one of a first logic level equal to said second power voltage and a second logic level equal to said reference potential, said first transistor being activated when said first intermediate signal having said first logic level is applied to said gate of said first transistor; and wherein said second intermediate signal output by said second conversion circuit is one of a first logic level equal to said first power voltage and a second logic level equal to said reference potential, said second transistor being activated when said second intermediate signal having said first logic level is applied to said gate of said second transistor, and wherein a voltage larger than a voltage between said second power voltage and said reference potential resulting from activation of said second transistor is prevented from being applied between said gate and a source of said second transistor; and wherein said second transistor is turned off when said second intermediate signal having said second logic level is applied to said gate of said second transistor.

* * * * *

UNITED STATES PATENT AND TRADEMARK OFFICE
CERTIFICATE OF CORRECTION

PATENT NO. : 5,416,368
DATED : May 16, 1995
INVENTOR(S) : Tadahiko Sugibayashi

It is certified that error appears in the above-indentified patent and that said Letters Patent is hereby corrected as shown below:

| | |
|---|---|
| Col. 3, Line 16 | delete "arc" and insert --are--; |
| Col. 4, Line 1 | delete "arc" and insert --are--; |
| Col. 4, Line 7 | delete "tile" and insert --the--; |
| Col. 4, Line 26 | delete "arc" and insert --are--; |
| Col. 4, Line 66 | after "when", insert --low--; |
| Col. 7, Line 12 | delete "arc" and insert --are--. |

Signed and Sealed this

Twenty-first Day of November, 1995

Attest:

BRUCE LEHMAN

*Attesting Officer*  *Commissioner of Patents and Trademarks*